United States Patent [19]

Gardner

[11] Patent Number: 4,799,451
[45] Date of Patent: Jan. 24, 1989

[54] ELECTRODE BOAT APPARATUS FOR PROCESSING SEMICONDUCTOR WAFERS OR THE LIKE

[75] Inventor: Steven J. Gardner, Scottsdale, Ariz.

[73] Assignee: ASM America, Inc., Phoenix, Ariz.

[21] Appl. No.: 17,778

[22] Filed: Feb. 20, 1987

[51] Int. Cl.⁴ .................. B05C 11/14; B05C 13/00
[52] U.S. Cl. ........................... 118/500; 118/728
[58] Field of Search ........... 204/192.1, 192.11, 192.12, 204/298; 156/345; 118/728, 729, 730, 731, 620, 500

[56] References Cited

U.S. PATENT DOCUMENTS

| | | | |
|---|---|---|---|
| 4,178,877 | 12/1979 | Kudo | 204/298 X |
| 4,223,048 | 9/1980 | Engle, Jr. | 204/298 |
| 4,287,851 | 9/1981 | Dozier | 204/298 X |

Primary Examiner—John F. Niebling
Assistant Examiner—Nam X. Nguyen
Attorney, Agent, or Firm—David G. Rosenbaum; Harry M. Weiss

[57] ABSTRACT

An electrode boat assembly for holding workpieces to be processed within a chemical reaction process during the chemical vapor process. The electrode boat assembly comprises a plurality of electrode plates held in position by rods and spacer sleeves in order to provide easy assembly and disassembly. Two of the rods are electrically conductive in order to set up plasma field between adjacent electrode plates. Insulating spacer sleeves over the conductive rods preclude plasma formation at unwanted locations. The spacers sleeves and electrode rods have substantially the same coefficient of thermal expansion to minimize warpage and breakage of electrode boat components.

13 Claims, 1 Drawing Sheet

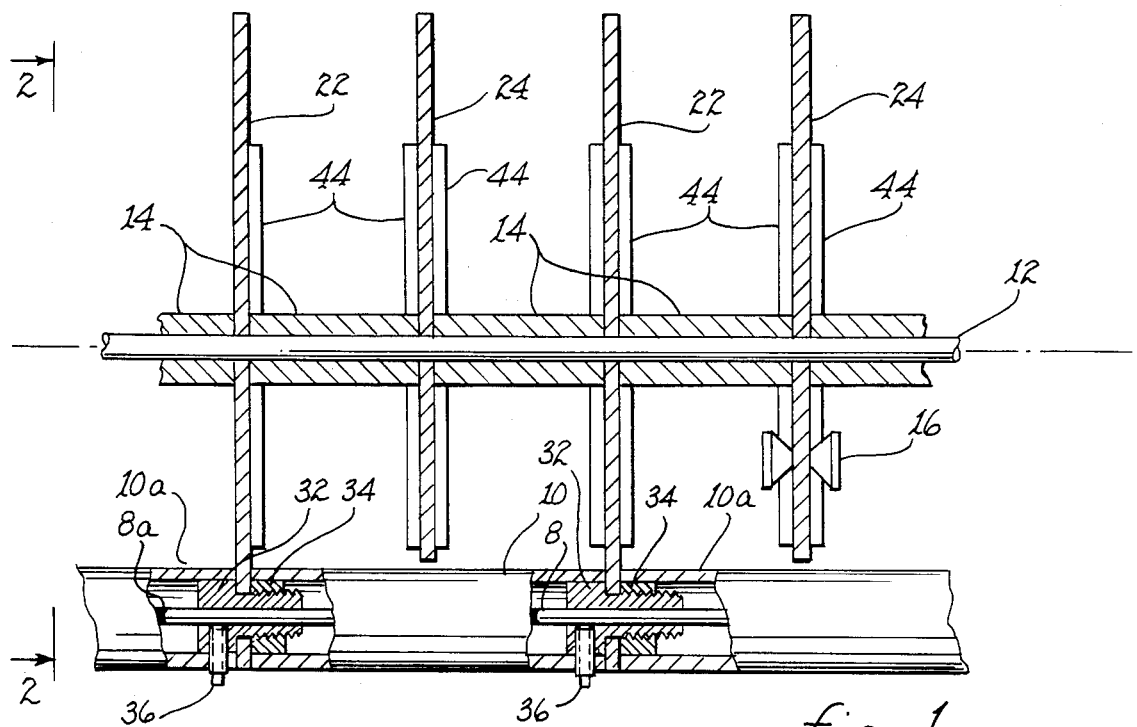
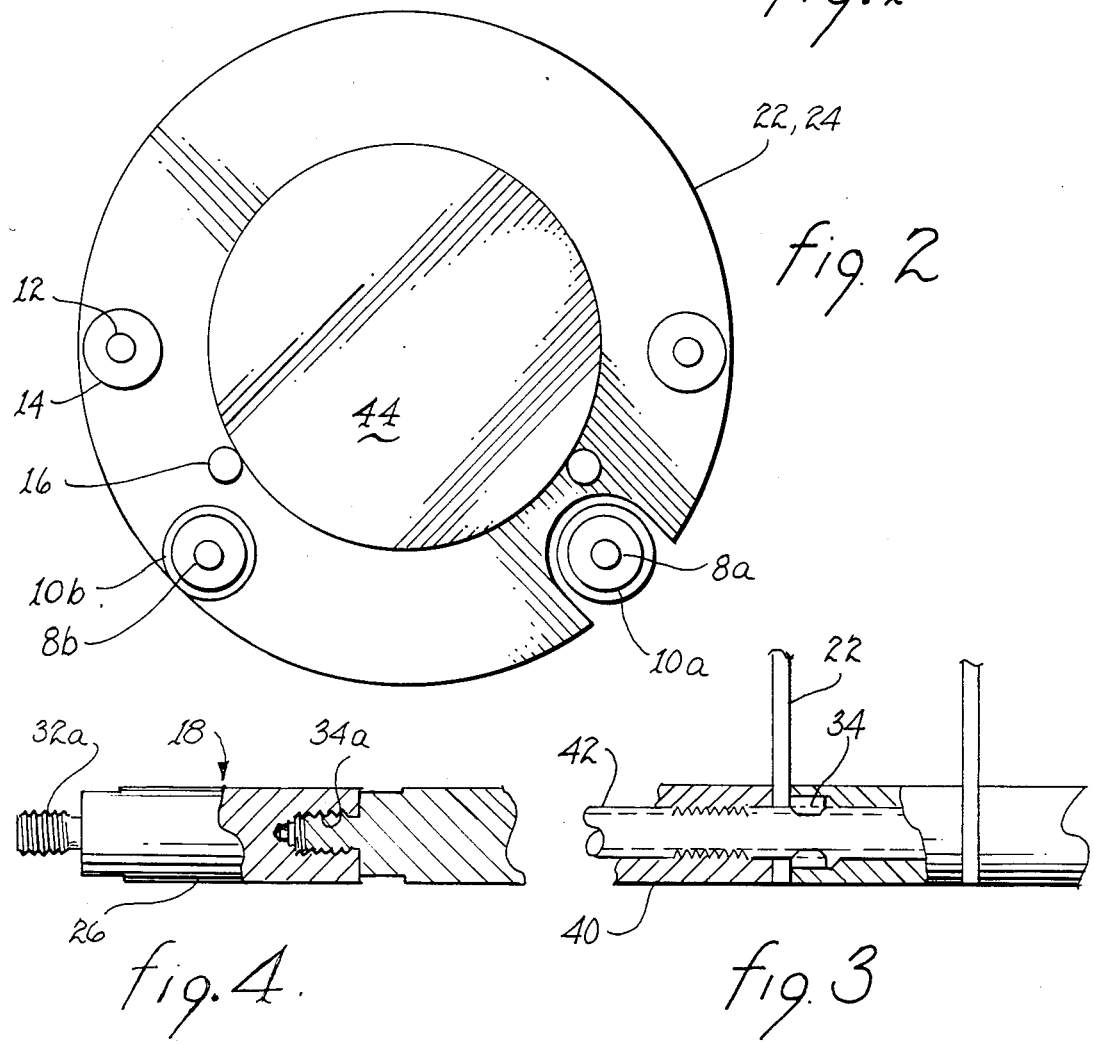

ELECTRODE BOAT APPARATUS FOR PROCESSING SEMICONDUCTOR WAFERS OR THE LIKE

BACKGROUND OF THE INVENTION

1. Field of the Invention

The present invention relates generally to an apparatus for processing semiconductor wafers and, more particularly, relates to a wafer boat assembly used to hold semiconductor wafers or the like within externally excited, chemical reaction systems wherein the reactant material flows over the wafers or workpieces which are held with their broad surfaces in perpendicular to the flow of the reactant material.

2. Description of the Prior Art

Plasma enhanced chemical vapor reactors are known in the art wherein the plasma reactant gas or gasses flow perpendicular to the broad surfaces of serially arranged workpieces. For instance, U.S. Pat. No. 4,401,507 issued to George M. Engle et al on Aug. 30, 1983, which is expressly incorporated herein by reference made thereto, is representative of the type of plasma chemical vapor reactor to which the present invention is applicable. The chemical reactor systems of the type disclosed in the U.S. Pat. No. 4,401,507, utilize an evacuable envelope retained in a furnace. A boat assembly that is removably inserted into the tabular envelope is used to hold workpieces perpendicular to the flow of the gas reactants that are passed through the tabular envelope during the deposition process onto the workpieces. Process uniformity is a great concern and ultimate goal in chemical vapor reactor systems. It is desirable to deposit a substantially uniform thickness of the film deposited onto the workpieces. Ideally, the film thickness on the workpieces processed in the chemical reactors should have a maximum of ±3% deviation wafer to wafer from one end of the loaded boat assembly to the other. In addition, it is desirable to be able to process as many workpieces as possible during each chemical vapor deposition process to maximize wafer throughput.

U.S. Pat. No. 4,610,748, issued to George M. Engle et al on Sept. 9, 1986 and entitled "Apparatus for Processing Semiconductor Wafers or the Like," which is also incorporated herein by reference made thereto, gives a detailed description of a boat assembly suitable for holding disc-shaped workpieces, such as semiconductor wafers, for processing in plasma enhanced chemical vapor reactors. While the boat assembly described in U.S. Pat. No. 4,610,748 represents a significant advance over known prior art, such a configuration is capable of improvement with respect to ease of disassembly for component replacement, assembly distortion during temperature excursions and component interchangeability between different sized assemblies used in diverse applications. It is also desirable to make a positive and reliable electrical contact to the electrode plates which support the workpieces. It is further very desirable to have a boat assembly which minimizes particulate contamination during processing.

Thus a need exists for an improved apparatus capable of being utilized in contemporary plasma enhanced chemical vapor deposition reactors which maintain process uniformity deviations below ±3% while, at the same time, allowing greater wafer throughput than is presently possible with conventional boat assemblies.

SUMMARY OF THE INVENTION

Accordingly, it is an object of the present invention to provide an improved boat apparatus for use in the processing of workpieces.

It is another object of this invention to provide an apparatus for improved process uniformity in an externally excited chemical reaction process.

Yet another object of the invention is to provide an apparatus for improved uniformity of etch rate, etch profile and selectively in an externally excited chemical reaction process.

Still another object of this invention is to provide an apparatus for permitting higher deposition rate using less peak power in an externally excited chemical reaction process.

A further object of this invention is to provide a boat assembly for use in a chemical reaction process which allows a large number of workpieces to be processed in a chemical reaction process with improved process uniformities.

It is still a further object of this invention to provide an electrode boat assembly for holding a large number of semiconductor wafers with their broad surfaces perpendicular to the flow of a reactant during processing in a chemical reaction process such that improved process components, high deposition rates and the use of less peak power are achieved.

It is yet another object of this invention to provide an electrode boat assembly which permits positive and reliable electrical contact to disc plate electrodes while permitting easy assembly and disassembly, yet which exhibits improved resistance to degradation during thermal excursions typically encountered in a processing sequence.

In accordance with the above and other objects hereinafter disclosed, there is provided an electrode boat assembly comprising a pair of conductive support members, each member having a plurality of interleaved electrode plates held thereto, and each member being covered by insulating means except where electrical connected to an electrode plate. Each conductive support member, which is preferably coaxially surrounded by the insulating means, has a coefficient of thermal expansion which is chosen to substantially match that of the insulating means. Compression fittings allow for positive electrical contact between the electrode plate and the conductive support member.

The foregoing and other features and advantages of the present invention will be apparent form the following description of the preferred embodiment as illustrated in the accompanying drawings.

BRIEF DESCRIPTION OF THE DRAWING

FIG. 1 is a side elevational partial cross sectional view of a portion of the electrode boat assembly portion of the electrode boat assembly according to the present invention.

FIG. 2 is a cross-sectional view of the electrode boat assembly portion taken along line 2—2 of FIG. 1.

FIG. 3 is a side elevational partial cross sectional view of a portion of the electrode boat assembly according to another preferred embodiment of the present invention.

FIG. 4 is an enlarged side elevational view partly in section showing another embodiment of a single, integral conductor rod assembly than can be used in place of the conductor rod screw or bolt and nut elements depicted in FIG. 1.

DETAILED DESCRIPTION OF THE INVENTION

Referring to FIG. 1 there is shown a portion of an electrode boat assembly suitable for use with the vapor processing apparatus as described in U.S. Pat. No. 4,223,048. The apparatus described in U.S. Pat. No. 4,223,048 may be but one of a variety of continuous or pulsed RF plasma enhanced or other chemical processing systems to which the electrode boat assembly according to the present invention may be applied.

The electrode boat portion shown in FIG. 1 comprises a plurality of interleaved electrodes 22 and 24. Electrodes 22 and 24 are preferably constructed of graphite or other conductive material resistant to high temperature chemical environments. Electrodes 22 are electrically common as are electrodes 24 so that an RF plasma may be set up in the space between each alternating pair of electrodes 22 and 24. Workpieces or semiconductor wafers 44 that are to be processed may be mounted on both faces of each electrode 22 and 24. The workpieces may be supported for example, by pegs 16, which may be wedge-shaped and are preferably constructed of the same material as electrodes 22 and 24. The electrode assembly is supported by a plurality of longitudinal support members including rods 8a and 12 and coaxial spacers 10a and 14. The extremities (not shown) of the longitudinal support members extend to terminal end members (not shown) which provide mechanical support and/or electrical contact, as described more completely in U.S. Pat. No. 4,610,748, hereinbefore incorporated by reference. Rod 12 in FIG. 1 is an insulating support member extending through a bore in each of the electrodes 22 and 24. Rod 12 preferably comprises alumina, and is coaxially surrounded by a plurality of insulating sleeves 14 also preferably of alumina, which provides further support and maintains the desired spacing between the plurality of electrodes 22 and 24.

Rod 8a comprises a conductive material for making electrical contact between electrode plates 22. Rod 8a passes through a bore in a conductive screw 32 which passes through electrode 22. Positive electrical contact to the electrode 22 is achieved by means of, for example, nut 34 which together with screw 32 provides a compression contact to electrode plate 22. Screws 32 may be secured to conducting rod 8a by set screws 36. Insulating sleeves 10a maintains interelectrode spacing and prevents spacious plasma formation at locations away from between workpieces 44. Such spurious plasma formation can seriously degrade the uniformity of films deposited on workpieces 44.

It is a particular feature of the present invention that conductive rod 8a has substantially the same coefficient of thermal expansion as the sleeves 10a and, preferably, the same as insulating rod 12 and sleeves 14. By providing substantially matched thermal expansion coefficients, shifting and distortion of electrode plates 22 and 24 is largely obviated during the large temperature excursions encountered in the vapor processing apparatus. Equally important, particulate contamination, which can be incorporated in the films to be deposited on the workpieces 44, is dramatically reduced. In the embodiment of FIG. 1, a preferred material for electrode rod 8a is a fine-grain, high-strength graphite material with a coefficient of thermal expansion of about 7.8 parts per million per centigrade degree. Such a material is available from the Poco Division of Unocal Corporation and is an excellent thermal match to the preferred alumina material of rod 12 and sleeve spacers a and 14.

As shown in FIG. 4, if desired, the nut 34 and the screw or bolt 32 together with the conductor rod 8 (see FIG. 1) can be made into a single integral piece, namely a conductor rod assembly 18, and effectively replace the function of the rod 8 while still maintaining all other physical constraints or parameters of the rod 8. The conductor rod assembly 18, comprises a conductive material for making electrical contact between electrode plates 22, and includes a bolt portion 32a, a nut portion 34a, and a spacer portion 26. One conductor rod assembly 18 is operably coupled to at least one other conductor rod assembly to form a continuous conductive line of any desired length (as determined by the amount or number of selected conductor rod assemblies 18 that are chosen to assemble or connect together as shown in FIG. 4) throughout the approximate length of the boat assembly.

Referring now to FIG. 2, there is shown a cross-sectional view of the electrode boat portion of FIG. 1. A notch in the lower left hand portion of electrode plate 22 is employed to allow a second conducting rod 8b and insulating sleeve spacer 10b to pass through the electrode plate 22 without making electrical contact. It will be appreciated by those skilled in the art, that a similar notch will be used in each of the electrode plates, with electrode plates 24 having the notch in the lower right hand corner, to permit contact to alternating electrode plates by each electrode rod 8a and 8b. The use of electrode rod 8a or 8b and two insulating rods 12 with their associated sleeve spacers provide three points of support for each electrode plate. Additionally insulating rods and spacer sleeves may be provided for very large electrode plates.

FIG. 3 shows a portion of an electrode boat according to another preferred embodiment of this invention. This embodiment is substantially similar to that of FIG. 1, except that the electrode rod 42, which replaced electrode rod 8a of FIG. 1, is threaded alumina metallized with nickel for conductivity. Spacer sleeve 40, also of alumina, separates alternating pairs of electrode plates 22, and a nickel nut 34 is used to provide positive electrical contact between electrode rod 40 and electrode plates 22. Again, a substantial thermal expansion coefficient match is achieved between the electrode rod 40 and spacer sleeve 40.

In either of the preferred embodiments, the use of the supporting rods, insulating sleeve spacers, and threaded contact assemblies allows rapid assembly of the boat and rapid disassembly for cleaning or replacement of defective elements. Also, this type of assembly is adaptable to electrode plates of any size so that most components are interchangeable. By use of electrode boat assemblies according to this invention, deposition uniformities of better than 2% (across a workpiece, from workpiece-to-workpiece, and run-to-run) have been achieved. Additionally, there is substantial absence of particulate contamination.

While the instant invention has been particularly illustrated and described with respect to preferred embodiment thereof, those skilled in the art will recognize that various changes in form and materials may be made without departing from the spirit thereof. For example, the conductive rods inside the alumina spacer sleeves could be Kovar or Rodar alloys as well as the preferred graphite or metallized alumina materials.

What is claimed is:

1. In a chemical vapor processing apparatus for processing workpieces in a plasma reaction within an evacuable envelope for containing the chemical vapor and the workpieces, an electrode boat assembly removably insertable within the envelope, comprising:

a plurality of electrically conductive electrode plate members, each of said electrode plate members having a plurality of openings passing therethrough and each of said electrode plate members being interleaved with respect to each other such that correspondingly positioned openings in each of said plurality of electrode plate members are in axial alignment along a length of the electrode boat assembly thereby forming a plurality of sets of axially aligned openings;

a plurality of insulating support rod members, one of said plurality of insulting support rod members passing through one of said plurality of sets of axially aligned openings;

at least one conducting rod passing through at least one set of axially aligned openings in said plurality of electrode plate members, said conducting rod electrically contacting every other one of said plurality of electrode plate members; and a plurality of insulating sleeve means disposed co-axially on each of said plurality of insulating rods and said at least one conductive rod and further disposed between interleaved pairs of said plurality of electrode plate members for supporting and spacing each of said plurality of electrode plate members, wherein said plurality of insulating rods, said at least one conductive rod, and said plurality of insulating sleeve means all have substantially the same coefficient of thermal expansion.

2. The boat assembly according to claim 1, wherein said conducting rod comprises graphite, and said plurality of insulating sleeve means comprises alumina.

3. The boat assembly according to claim 1, wherein said conducting rod comprises metallized alumina, and said plurality of insulating sleeve means comprise alumina.

4. The boat assembly according to claim 1, further comprising threaded means over said conducting rod for making positive electrical contact to said electrode plate members.

5. The boat assembly according to claim 1, wherein said conducting rod comprises Kovar.

6. The boat assembly according to claim 1, wherein said conducting rod comprises Rodar.

7. The boat assembly according to claim 1, wherein said at least one conductive rod further comprises a plurality of conductive members each having an externally threaded male member on one end thereof and an internally threaded female member in another end thereof.

8. An electrode boat assembly for processing workpieces in a plasma reaction within an evacuable envelope for containing the chemical vapor and the workpieces, comprising:

a plurality of electrically conductive electrode plate members, each of said electrode plate members having a plurality of openings passing therethrough and each of said electrode plate members being interleaved with respect to each other such that correspondingly positioned openings in each of said plurality of electrode plate members are in axial alignment along a length of the electrode boat assembly thereby forming a plurality of sets of axially aligned openings;

a plurality of insulating support rod members, one of said plurality of insulating support rod members passing through each of said plurality of sets of axially aligned openings;

a plurality of conductive compression having a plurality of conductive screw means fitting means for making positive electrical contact to said plurality of electrode plates, each of said plurality of conductive screw means having a longitudinal bore passing therethrough;

at least one conducting rod passing through said longitudinal bore of each of said plurality of conductive compression fitting means and further passing through at least one set of axially aligned openings in said plurality of electrode plate members, said conducting rod electrically contacting every other one of said plurality of electrode members; and a plurality of insulating sleeve means disposed coaxially on each of said plurality of insulating rods and said at least one conductive rod and further disposed between interleaved pairs of said plurality of electrode members for supporting and spacing each of said plurality of electrode members, wherein said plurality of insulating rods, said at least one conductive rod, and said plurality of insulating sleeve means all have substantially the same coefficient of thermal expansion.

9. The boat assembly according to claim 8, wherein said conducting rod comprises graphite, and said plurality of insulating sleeve means comprises alumina.

10. The boat assembly according to claim 8, wherein said conducting rod comprises metallized alumina, and said plurality of insulating sleeve means comprise alumina.

11. The boat assembly according to claim 8, wherein said conductive compression fitting means further comprises a plurality of conductive members each having an externally threaded male member on one end thereof and an internally threaded female member in another end thereof.

12. The boat assembly according to claim 8, wherein said conductive rod comprises Kovar.

13. The boat assembly according to claim 8, wherein said conductive rod comprises Rodar.

* * * * *

UNITED STATES PATENT AND TRADEMARK OFFICE
CERTIFICATE OF CORRECTION

PATENT NO. : 4,799,451

DATED : Jan. 24, 1989

INVENTOR(S) : Steven J. Gardner

It is certified that error appears in the above-identified patent and that said Letters Patent is hereby corrected as shown below:

In Claim 8, Column 6, Line 19, after the word "compression", please delete the phrase -- having a plurality of conductive screw means -- and insert this deleted phrase after the word "means" on line 20.

Signed and Sealed this

Twenty-second Day of August, 1989

Attest:

DONALD J. QUIGG

Attesting Officer

Commissioner of Patents and Trademarks